United States Patent
Yamazaki et al.

(10) Patent No.: US 9,461,617 B2
(45) Date of Patent: Oct. 4, 2016

(54) PIEZOELECTRIC FILM PRODUCING PROCESS, VIBRATOR ELEMENT, VIBRATOR, OSCILLATOR, ELECTRONIC DEVICE, AND MOVING OBJECT

(71) Applicant: SEIKO EPSON CORPORATION, Tokyo (JP)

(72) Inventors: Takashi Yamazaki, Shiojiri (JP); Osamu Iwamoto, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/727,215

(22) Filed: Jun. 1, 2015

(65) Prior Publication Data
US 2015/0295558 A1   Oct. 15, 2015

Related U.S. Application Data

(62) Division of application No. 14/330,626, filed on Jul. 14, 2014.

(30) Foreign Application Priority Data

Jul. 22, 2013 (JP) .................................. 2013-151378

(51) Int. Cl.
*H03B 5/32* (2006.01)
*H01L 41/18* (2006.01)
*H01L 41/37* (2013.01)
(Continued)

(52) U.S. Cl.
CPC .............. *H03H 9/171* (2013.01); *C22C 21/12* (2013.01); *C23C 14/06* (2013.01); *C23C 14/0688* (2013.01); *C23C 14/3414* (2013.01); *H01L 41/18* (2013.01); *H01L 41/37* (2013.01); *H03B 5/32* (2013.01); *H01L 41/094* (2013.01); *H01L 41/187* (2013.01)

(58) Field of Classification Search
CPC .............. C22C 21/12; C23C 14/0021; C23C 14/0036; C23C 14/14; C23C 14/34; C23C 14/3407; H01L 41/18; H01L 41/22; H01L 41/35; H01L 41/37; H01L 41/39; H01L 41/41; H01L 41/43; H01L 41/45; H03B 5/30; H03B 5/32; H03H 3/02
USPC ........... 29/25.35; 204/192.1, 192.12, 192.15, 204/192.18; 331/154, 156, 158; 427/100
See application file for complete search history.

(56) References Cited

U.S. PATENT DOCUMENTS

| 5,317,006 A | 5/1994 | Kumar |
| 5,918,354 A | 7/1999 | Ikegami et al. |

(Continued)

FOREIGN PATENT DOCUMENTS

| JP | H07-274289 A | 10/1995 |
| JP | 2005-347898 A | 12/2005 |
| JP | 2013-034130 A | 2/2013 |

OTHER PUBLICATIONS

Jun. 24, 2015 Office Action issued in U.S. Appl. No. 14/330,626.

(Continued)

*Primary Examiner* — Levi Gannon
(74) *Attorney, Agent, or Firm* — Oliff PLC

(57) ABSTRACT

A vibrator element includes: a base portion; and a vibrating arm extending from the base portion, the vibrating arm including a piezoelectric film that contains Cu at a crystal grain boundary.

7 Claims, 7 Drawing Sheets

(51) Int. Cl.
*H03H 9/17* (2006.01)
*C22C 21/12* (2006.01)
*C23C 14/06* (2006.01)
*C23C 14/34* (2006.01)
*H01L 41/09* (2006.01)
*H01L 41/187* (2006.01)

(56) References Cited

U.S. PATENT DOCUMENTS

| | | |
|---|---|---|
| 6,271,619 B1 | 8/2001 | Yamada et al. |
| 7,102,461 B2 | 9/2006 | Nakano et al. |
| 7,467,447 B2 | 12/2008 | Nakano et al. |
| 7,521,846 B2 * | 4/2009 | Tanaya ............... G01C 19/5607 310/368 |
| 2005/0264137 A1 | 12/2005 | Taniguchi et al. |
| 2009/0045704 A1 | 2/2009 | Barber et al. |
| 2011/0156827 A1 * | 6/2011 | Kawai ................. H03H 9/0547 331/116 R |
| 2011/0298555 A1 * | 12/2011 | Kawai ...................... H03H 3/04 331/158 |
| 2013/0033151 A1 | 2/2013 | Ueda et al. |

OTHER PUBLICATIONS

Apr. 3, 2015 Restriction Requirement issued in U.S. Appl. No. 14/330,626.

* cited by examiner

| No. | DEPOSITION CONDITION | RESULT OF PIEZOELECTRIC BODY EVALUATION | | |
|---|---|---|---|---|
| | $N_2$(%) : Ar(%) | SHEET RESISTANCE ($\Omega\square$) | FWHM (DEGREE) | EVALUATION RESULT |
| 1 | 99 : 1 | INFINITY | 3,18 | GOOD |
| 2 | 80 : 20 | INFINITY | 3,42 | GOOD |
| 3 | 70 : 30 | INFINITY | 3,43 | GOOD |
| 4 | 60 : 40 | INFINITY | 3,69 | GOOD |
| 5 | 50 : 50 | 31146 | 3,50 | ACCEPTABLE |
| 6 | 40 : 60 | 0,3100 | INCALCULABLE | POOR |
| 7 | 10 : 90 | 0,0621 | INCALCULABLE | POOR |

FIG. 4

PIEZOELECTRIC FILM PRODUCING PROCESS, VIBRATOR ELEMENT, VIBRATOR, OSCILLATOR, ELECTRONIC DEVICE, AND MOVING OBJECT

CROSS REFERENCE TO THE RELATED APPLICATIONS

This is a divisional application of U.S. application Ser. No. 14/330,626, filed Jul. 14, 2014, which claims priority to Japanese Patent Application No. 2013-151378, filed Jul. 22, 2013, the entire disclosures of which are expressly incorporated by reference herein.

BACKGROUND

1. Technical Field

The present invention relates to a piezoelectric film producing process, a vibrator element that includes a piezoelectric film produced by the process, and vibrators, oscillators, electronic devices, and moving objects that include the vibrator element.

2. Related Art

A piezoelectric thin film resonator (hereinafter, referred to as "vibrator element") is known that is configured to include a lower electrode provided on a substrate, a piezoelectric film provided on the lower electrode, and an upper electrode provided on the piezoelectric film, and having a region opposite the lower electrode with the piezoelectric film in between (see, for example, JP-A-2013-34130).

The vibrator element uses aluminum nitride (hereinafter, "AlN") for the piezoelectric film. The piezoelectric film is deposited (formed) by sputtering, using Al (aluminum) as the target material (deposition material) in a mixed atmosphere of $N_2$ (nitrogen) gas and Ar (argon) gas.

However, because the piezoelectric film uses pure aluminum as deposition material, processes such as the deposition of the upper electrode after the AlN deposition may produce internal stress in the aluminum present at the crystal grain boundaries of the deposited AlN.

The piezoelectric film thus involves the risk of generating stress migration, forming voids in the aluminum.

The resulting degradation of electromechanical coupling coefficient increases the impedance of the piezoelectric film. This may cause deterioration in the function of the piezoelectric film, and the reliability (long-term reliability in particular) may suffer as a result of the progression of stress migration (e.g., void diffusion).

This may lead to an increase in the CI (crystal impedance) value of the vibrator element that includes the piezoelectric film, and the vibration characteristics and the reliability of the vibrator element may suffer.

SUMMARY

An advantage of some aspects of the invention is to solve at least a part of the problems described above, and the invention can be implemented as the following forms or application examples.

APPLICATION EXAMPLE 1

A piezoelectric film producing process according to this application example includes depositing a piezoelectric film in a mixed atmosphere of $N_2$ gas and Ar gas by using a sputtering method, using an Al—Cu alloy as deposition material.

The piezoelectric film producing process includes depositing a piezoelectric film in a mixed atmosphere of $N_2$ gas and Ar gas by using a sputtering method, using an Al—Cu alloy as deposition material (target material).

Because the piezoelectric film producing process uses an Al—Cu alloy as the deposition material of the piezoelectric film, the copper exists by being dispersed in aluminum at the crystal grain boundaries of the piezoelectric film (specifically, AlN film) deposited by sputtering (in other words, intermetallic compound ($Al_3Cu$) is produced).

Diffusion of aluminum at the crystal grain boundaries, and thus generation of stress migration can thus be suppressed with the piezoelectric film producing process.

The piezoelectric film producing process can thus improve the function of the piezoelectric film as compared to the producing process of related art (for example, JP-A-2013-34130), and can suppress stress migration to improve the reliability of the piezoelectric film.

APPLICATION EXAMPLE 2

In the piezoelectric film producing process according to the application example described above, it is preferable that the Cu content in the Al—Cu alloy ranges from 0.25 mass % to 1.0 mass %.

With the Cu content of 0.25 mass % to 1.0 mass % in the Al—Cu alloy, the piezoelectric film producing process can suppress Al diffusion at the crystal grain boundaries, and generation of stress migration.

APPLICATION EXAMPLE 3

In the piezoelectric film producing process according to the application example described above, it is preferable that the Cu content in the Al—Cu alloy ranges from 0.4 mass % to 0.6 mass %.

With the Cu content of 0.4 mass % to 0.6 mass % in the Al—Cu alloy, the piezoelectric film producing process can further suppress Al diffusion at the crystal grain boundaries, and generation of stress migration.

APPLICATION EXAMPLE 4

In the piezoelectric film producing process according to the application example described above, it is preferable that the mixture ratio of the $N_2$ gas and the Ar gas ranges from $N_2$ gas 50 volume %: Ar gas 50 volume % to $N_2$ gas 99 volume %: Ar gas 1 volume %.

With the $N_2$ gas and Ar gas mixture ratio of $N_2$ gas 50 volume %: Ar gas 50 volume % to $N_2$ gas 99 volume %: Ar gas 1 volume %, the piezoelectric film producing process can produce a desirably functioning piezoelectric film (specifically, AlN film) by using a sputtering method.

APPLICATION EXAMPLE 5

A vibrator element according to this application example includes a base portion, and a vibrating arm extending from the base portion, wherein the vibrating arm includes a piezoelectric film that contains Cu at a crystal grain boundary.

The vibrator element includes a base portion, and a vibrating arm extending from the base portion, and the vibrating arm includes a piezoelectric film (specifically, AlN film) that contains Cu at the crystal grain boundary. This makes it possible to suppress generation of stress migration in the piezoelectric film.

The vibrator element can thus improve the function of the piezoelectric film as compared to related art (for example, JP-A-2013-34130), and the reliability of the piezoelectric film.

By thus lowering the CI value, the vibrator element can improve its vibration characteristics and reliability.

APPLICATION EXAMPLE 6

A vibrator according to this application Example includes the vibrator element according to the application example described above, and a package housing the vibrator element.

The vibrator of this configuration includes the vibrator element according to the application example described above, and a package housing the vibrator element. This makes it possible to provide a highly reliable vibrator having the effects described in the application example described above.

APPLICATION EXAMPLE 7

An oscillator according to this application example includes the vibrator element according to the application example described above, and an oscillation circuit that oscillates the vibrator element.

The oscillator of this configuration includes the vibrator element according to the application example described above, and an oscillation circuit that oscillates the vibrator element. This makes it possible to provide a highly reliable oscillator having the effects described in the application example described above.

APPLICATION EXAMPLE 8

An electronic device according to this application example includes the vibrator element according to the application example described above.

The electronic device of this configuration includes the vibrator element according to the application example described above. This makes it possible to provide a highly reliable electronic device having the effects described in the application example described above.

APPLICATION EXAMPLE 9

A moving object according to this application example includes the vibrator element according to the application example described above.

The moving object of this configuration includes the vibrator element according to the application example described above. This makes it possible to provide a highly reliable moving object having the effects described in the application example described above.

BRIEF DESCRIPTION OF THE DRAWINGS

The invention will be described with reference to the accompanying drawings, wherein like numbers reference like elements.

FIGS. 1A and 1B are schematic diagrams illustrating a schematic structure of a vibrator element of First Embodiment, in which FIG. 1A is a plan view, and FIG. 1B is a cross sectional view taken at line A-A of FIG. 1A.

FIG. 4 is a diagram representing piezoelectric body deposition conditions, and corresponding evaluation results.

FIGS. 5A and 5B are schematic diagrams illustrating a schematic structure of a vibrator of Second Embodiment, in which FIG. 5A is a plan view as viewed from the lid (cap) side, and FIG. 5B is a cross sectional view taken at line C-C of FIG. 5A.

FIGS. 6A and 6B are schematic diagrams illustrating a schematic structure of an oscillator of Third Embodiment, in which FIG. 6A is a plan view as viewed from the lid side, and FIG. 6B is a cross sectional view taken at line C-C of FIG. 6A.

DESCRIPTION OF EXEMPLARY EMBODIMENTS

Embodiments of specific implementation of the invention are described below with reference to the accompanying drawings.

First Embodiment

A vibrator element that uses a Si (silicon) base material is described as an example of the vibrator element.

Figure 1A:
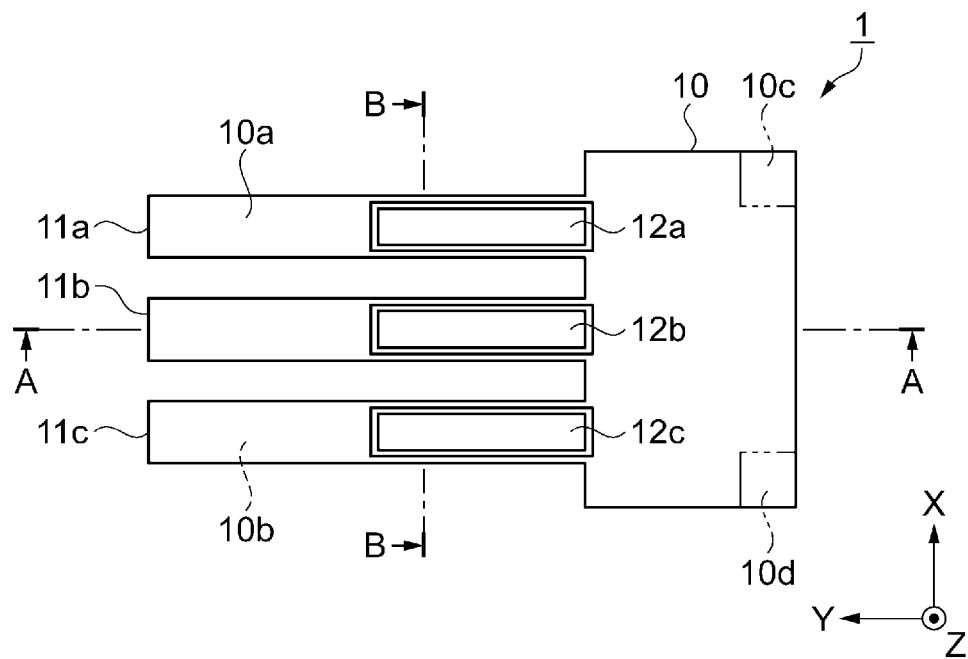
Figure 1B:
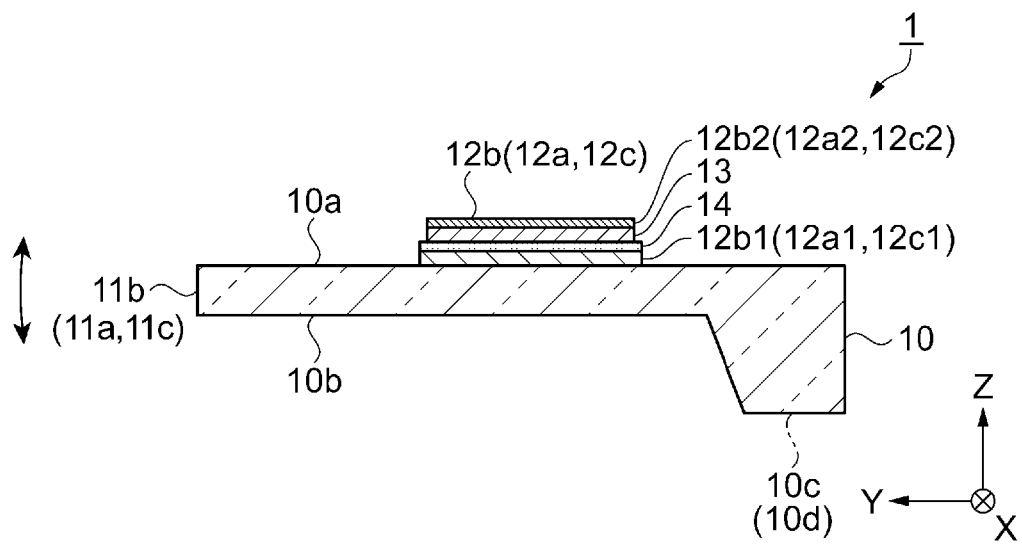

FIGS. 1A and 1B are schematic diagrams illustrating a schematic structure of the vibrator element of First Embodiment. FIG. 1A is a plan view, and FIG. 1B is a cross sectional view taken at line A-A of FIG. 1A. Wires are omitted, and the dimensional ratio of each constituting element differs from the actual dimension ratios.

Figure 2:
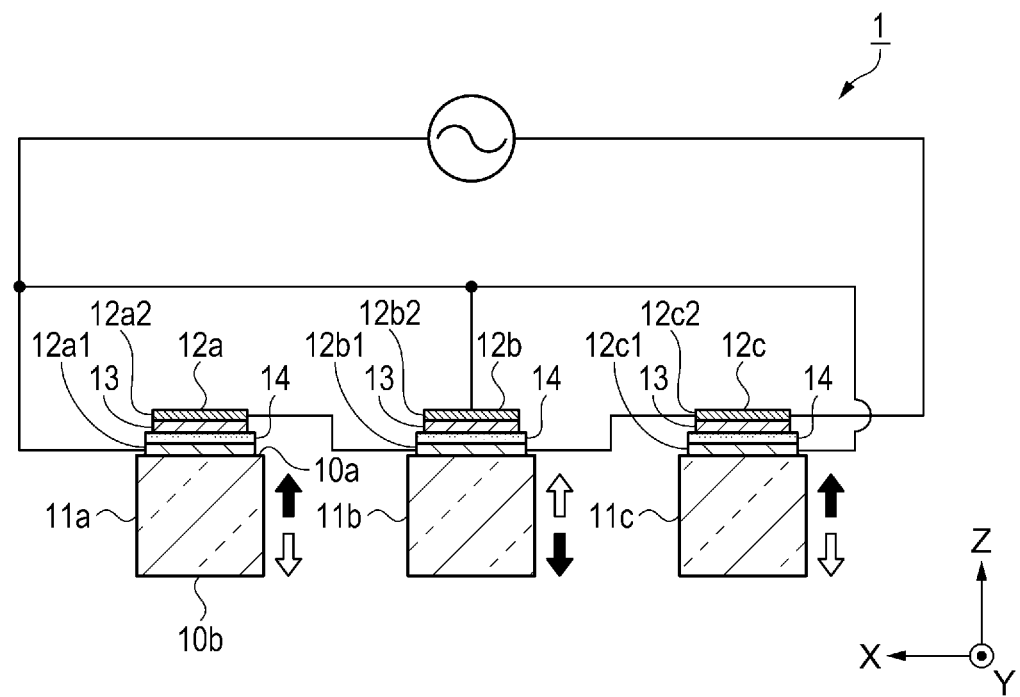
FIG. 2 is a cross sectional view taken at line B-B of FIG. 1A, shown alongside with a wiring diagram of each excitation electrode.

FIG. 2 is a cross sectional view taken at line B-B of FIG. 1A, shown alongside with a wiring diagram of each excitation electrode.

In the drawings, the X, Y, and Z axes are coordinate axes that are orthogonal to each other.

As illustrated in FIGS. 1A and 1B, the base material of a vibrator element 1 includes a base portion 10, and three vibrating arms 11a, 11b, and 11c extending from the base portion 10 in Y-axis direction. In the present embodiment, a Si substrate (for example, a SOI-, or Poly-Si-deposited substrate) is used for the three vibrating arms 11a, 11b, and 11c, and the base portion 10.

The vibrating arms 11a, 11b, and 11c have a form of substantially a rectangular column. The vibrating arms 11a, 11b, and 11c include excitation electrodes 12a, 12b, and 12c. The excitation electrodes 12a, 12b, and 12c are aligned in X-axis direction orthogonal to Y-axis direction in planar view, and are provided on at least one of major surfaces 10a and 10b (here, on the major surface 10a) that lie on the plane (XY plane) specified by X axis and Y axis.

The excitation electrodes 12a, 12b, and 12c cause flexural vibration (antiplane vibration: occurring in directions that are not along the major surface 10a) in the vibrating arms 11a, 11b, and 11c along Z-axis direction orthogonal to the major surface 10a (the direction of arrow in FIG. 1B).

The base portion 10, the vibrating arms 11a, 11b, and 11c, and the excitation electrodes 12a, 12b, and 12c are formed with high accuracy by using methods, for example, such as sputtering, photolithography, and etching.

The excitation electrodes 12a, 12b, and 12c have a laminate structure including first electrodes 12a1, 12b1, and 12c1 provided on the major surface 10a side, second electrodes 12a2, 12b2, and 12c2 provided above the first electrodes 12a1, 12b1, and 12c1, a piezoelectric body 13 disposed as a piezoelectric film between the first electrodes 12a1, 12b1, and 12c1 and the second electrodes 12a2, 12b2, and 12c2, and an insulating film 14 provided between the first electrodes 12a1, 12b1, and 12c1 and the piezoelectric body 13. The insulating film 14 may be omitted.

The first electrodes 12a1, 12b1, and 12c1, and the second electrodes 12a2, 12b2, and 12c2 of the excitation electrodes 12a, 12b, and 12c use a film that contains TiN (titanium nitride). The piezoelectric body 13 uses a film that contains AlN (aluminum nitride). The insulating film 14 uses a film that contains amorphous $SiO_2$ (silicon dioxide).

The piezoelectric body 13 is formed (deposited) by sputtering, using an Al—Cu alloy as deposition material (target material), as will be described later in detail.

For desirable vibration characteristics of the vibration reed 1, the first electrodes 12a1, 12b1, and 12c1, and the second electrodes 12a2, 12b2, and 12c2 of the excitation electrodes 12a, 12b, and 12c have a thickness of preferably about 15 nm. For the same reason, the piezoelectric body 13 has a thickness of preferably about 200 nm to 400 nm, and the insulating film 14 has a thickness of preferably about 10 nm.

The first electrodes 12a1, 12b1, and 12c1, and the second electrodes 12a2, 12b2, and 12c2 may use a film containing materials (for example, such as Mo, Ti, Ni, Pt, Au, W, WSi, Ta, and ITO) different from TiN.

It is preferable for efficient vibration characteristics that the excitation electrodes 12a, 12b, and 12c extend towards the tip portion from the root portion of the vibrating arms 11a, 11b, and 11c (the boundary portion from the base portion 10) in about a half length of the full length (from the root to the tip along Y-axis direction) of the vibrating arms 11a, 11b, and 11c.

As illustrated in FIG. 1B, the base portion 10 is thicker than the vibrating arms 11a, 11b, and 11c in Z-axis direction.

The base portion 10 has fixing portions 10c and 10d providing regions for fixing external members such as a package. The fixing portions 10c and 10d are provided on the major surface 10b side of the base portion 10 at the both ends relative to X-axis direction, as indicated by long dashed double-short dashed line in FIG. 1A. Preferably, the fixing portions 10c and 10d are provided at the end of the base portion 10 opposite the vibrating arms 11a, 11b, and 11c in Y-axis direction.

The operation of the vibrator element 1 is described below.

As illustrated in FIG. 2, the first electrodes 12a1, 12b1, and 12c1, and the second electrodes 12a2, 12b2, and 12c2 of the excitation electrodes 12a, 12b, and 12c in the vibrator element 1 are connected to an alternate current power supply by crossed wires, and a driving alternating voltage is applied to these electrodes.

Specifically, the first electrode 12a1 of the vibrating arm 11a, the second electrode 12b2 of the vibrating arm 11b, and the first electrode 12c1 of the vibrating arm 11c are connected to bring these electrodes at the same potential. The second electrode 12a2 of the vibrating arm 11a, the first electrode 12b1 of the vibrating arm 11b, and the second electrode 12c2 of the vibrating arm 11c are connected to bring these electrodes at the same potential.

Applying alternating voltage between the first electrodes 12a1, 12b1, and 12c1 and the second electrodes 12a2, 12b2, and 12c2 in this state generates an electric field between the first electrodes 12a1, 12b1, and 12c1 and the second electrodes 12a2, 12b2, and 12c2. The piezoelectric body 13 polarizes under the generated electric field, and the reverse piezoelectric effect produces strains in the piezoelectric body 13, causing the piezoelectric body 13 to expand and contract in Y-axis direction.

The vibrator element 1 is configured so that the direction of the electric field generated by the crossed wires in the excitation electrodes 12a and 12c becomes opposite of that generated in the excitation electrode 12b, and the piezoelectric body 13 expands and contracts in opposite ways between the vibrating arms 11a and 11c and the vibrating arm 11b.

Specifically, the piezoelectric body 13 of the vibrating arm 11b contracts when the piezoelectric bodies 13 of the vibrating arms 11a and 11c expand, and the piezoelectric body 13 of the vibrating arm 11b expands when the piezoelectric bodies 13 of the vibrating arms 11a and 11c contract.

With such expansion and contraction of the piezoelectric bodies 13 in the vibrator element 1, the vibrating arms 11a, 11b, and 11c bend in the direction of black arrow when the alternating voltage is at one potential, and in the direction of blank arrow when the alternating voltage is at the other potential.

By repeating these movements, the vibrating arms 11a, 11b, and 11c in the vibrator element 1 undergo flexural vibration (antiplane vibration) in Z-axis direction. Here, flexural vibration occurs in reverse direction (reverse phase) between the adjacent vibrating arms (between 11a and 11b, and between 11b and 11c in this embodiment).

A process for producing the piezoelectric body 13 as a constituting element of the excitation electrodes 12a, 12b, and 12c of the vibrator element 1 is described below (piezoelectric film producing process).

Figure 3:
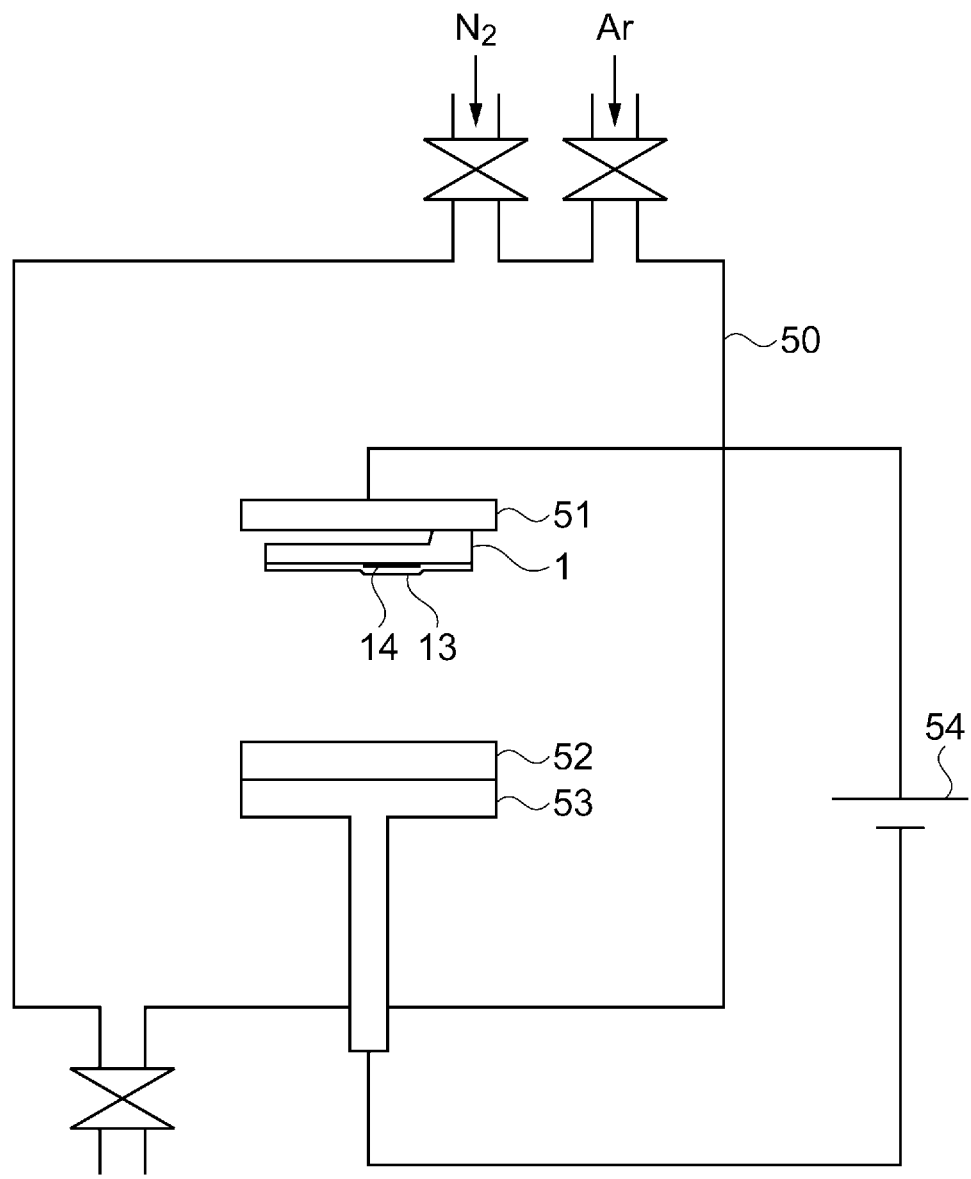
FIG. 3 is a schematic diagram explaining a piezoelectric body producing process.

FIG. 3 is a schematic diagram explaining the piezoelectric body producing process.

As illustrated in FIG. 3, the vibrator element 1 with the first electrodes 12a1, 12b1, and 12c1 (not illustrated in the figure) and the insulating film 14 is set on a base mount 51 in a vacuum chamber 50.

Thereafter, $N_2$ (nitrogen) gas and Ar (argon) gas are introduced into the vacuum chamber 50 with a vacuum pump or the like (not illustrated) to produce a mixed atmosphere of $N_2$ gas and Ar gas.

Here, the pressure inside the vacuum chamber 50 is preferably about 0.53 Pa (4 mTorr). The $N_2$ gas and Ar gas mixture ratio preferably ranges from $N_2$ gas 50 volume %: Ar gas 50 volume % to $N_2$ gas 99 volume %: Ar gas 1 volume %.

The vibrator element 1 is preferably kept at ordinary temperature.

An Al—Cu alloy 52 as deposition material (target material) is then set on a target mount 53.

The Cu content in the Al—Cu alloy is preferably 0.25 mass % to 1.0 mass %, more preferably 0.4 mass % to 0.6 mass %.

Thereafter, a power supply 54 applies voltage (for example, about 100 V to 1,000 V) by using a sputtering method (reactive sputtering), using the Al—Cu alloy 52 as cathode, and the vibrator element 1 as anode.

In response, the ion atoms in the mixed gas of $N_2$ gas and Ar gas sputter the surface of the Al—Cu alloy 52, and the particles (atoms and molecules) jumped out of the Al—Cu alloy 52 deposit and fix to the vibrator element 1, covering the insulating film 14. This deposits (forms) the piezoelectric body 13 (AlN film).

The piezoelectric body 13 is then patterned into a desired shape by using methods such as photolithography, and etching.

The piezoelectric body 13 can be obtained in this manner after these steps.

This is followed by formation of the second electrodes 12a2, 12b2, and 12c2 on the piezoelectric body 13 by using methods such as sputtering, photolithography, and etching, and the vibrator element 1 shown in FIGS. 1A and 1B, and FIG. 2 is obtained.

As described above, the process for producing the piezoelectric body 13 of the present embodiment (hereinafter, "piezoelectric film producing process") includes depositing the piezoelectric body 13 (piezoelectric film) in a mixed atmosphere of $N_2$ gas and Ar gas by using a sputtering method, using an Al—Cu alloy as deposition material (target material).

Because the piezoelectric film producing process uses the Al—Cu alloy as deposition material for the deposition of the piezoelectric body 13, the copper exists by being dispersed in aluminum at the crystal grain boundaries of the piezoelectric body 13 (specifically, AlN film) deposited as the piezoelectric film by sputtering (in other words, intermetallic compound ($Al_3Cu$) is produced).

Diffusion of aluminum at the crystal grain boundaries of the piezoelectric body 13, and thus generation of stress migration can thus be suppressed with the piezoelectric film producing process.

The piezoelectric film producing process can thus improve the function of the piezoelectric body 13 as compared to the producing process of related art (for example, JP-A-2013-34130), and can suppress stress migration to improve the reliability of the piezoelectric body 13.

Further, because the Cu content in the Al—Cu alloy ranges from 0.25 mass % to 1.0 mass %, the piezoelectric film producing process can suppress Al diffusion at the crystal grain boundaries of the piezoelectric body 13, and thus generation of stress migration.

Further, because the Cu content in the Al—Cu alloy ranges from 0.4 mass % to 0.6 mass %, the piezoelectric film producing process can further suppress Al diffusion at the crystal grain boundaries of the piezoelectric body 13, and thus generation of stress migration.

Further, because the $N_2$ gas and Ar gas mixture ratio ranges from $N_2$ gas 50 volume %: Ar gas 50 volume % to $N_2$ gas 99 volume %: Ar gas 1 volume %, the piezoelectric body 13 (specifically, AlN film) produced by the piezoelectric film producing process by sputtering can be desirably functional.

The following describes the foregoing process in greater detail with reference to the drawings.

FIG. 4 is a diagram representing piezoelectric body deposition conditions ($N_2$ gas and Ar gas mixture ratios), and corresponding evaluation results for each sample.

The sheet resistance of the piezoelectric body 13 should be about at least 30,000 Ω☐ (ohm square), and a 3- to 4-degree angle is considered sufficient for FWHM (half width of the peak in the X-ray diffraction orientation evaluation of the piezoelectric body 13).

In the evaluation results, "Good" and "Acceptable" mean that the piezoelectric body is practically satisfactory, and "Poor" means practically unsatisfactory. The Cu content in the deposition material Al—Cu alloy of the piezoelectric body 13 is 0.5 mass %.

As shown in FIG. 4, sample No. 1 ($N_2$ gas 99 volume %: Ar gas 1 volume %; in the following, the unit "volume %" will be omitted) has a sheet resistance of infinity Sri, and an FWHM of 3.18 degrees, and the evaluation result is "Good".

Sample No. 2 ($N_2$ gas 80: Ar gas 20) has a sheet resistance of infinity Ω☐, and an FWHM of 3.42 degrees, and the evaluation result is "Good".

Sample No. 3 ($N_2$ gas 70: Ar gas 30) has a sheet resistance of infinity Ω☐, and an FWHM of 3.43 degrees, and the evaluation result is "Good".

Sample No. 4 ($N_2$ gas 60: Ar gas 40) has a sheet resistance of infinity Ω☐, and an FWHM of 3.69 degrees, and the evaluation result is "Good".

Sample No. 5 ($N_2$ gas 50: Ar gas 50) has a sheet resistance of 31146 Ω☐, and an FWHM of 3.50 degrees, and the evaluation result is "Acceptable" ("Acceptable" because of the slightly smaller sheet resistance margin).

On the other hand, sample No. 6 ($N_2$ gas 40: Ar gas 60) has a sheet resistance of 0.3100 Ω☐, and the FWHM is incalculable (the peak is unclear, and the half width cannot be calculated), and the evaluation result is "Poor".

Sample No. 7 ($N_2$ gas 10: Ar gas 90) has a sheet resistance of 0.0621 Ω☐, and the FWHM is incalculable (the peak is unclear, and the half width cannot be calculated) , and the evaluation result is "Poor".

These evaluation results of the samples support that the piezoelectric body 13 produced by the piezoelectric film producing process using sputtering can desirably function (at practically satisfactory levels) when the $N_2$ gas and Ar gas mixture ratio ranges from $N_2$ gas 50 volume %: Ar gas 50 volume % to $N_2$ gas 99 volume %: Ar gas 1 volume %.

As described above, the vibrator element 1 of the present embodiment includes the base portion 10, and the vibrating arms 11a, 11b, and 11c extending from the base portion 10, and the piezoelectric body 13 provided for the vibrating arms 11a, 11b, and 11c is a piezoelectric film formed by using the Al—Cu alloy as deposition material. This makes it possible to suppress stress migration generation in the piezoelectric body 13.

The vibrator element 1 can thus improve the function of the piezoelectric body 13 (specifically, for example, expansion and contraction capability under applied electric field) as compared to related art (for example, JP-A-2013-34130), and the reliability of the piezoelectric body 13.

By thus lowering the CI value, the vibrator element 1 can improve its vibration characteristics and reliability.

The vibrator element 1 may include a $SiO_2$-containing film between the major surface 10a and the first electrodes 12a1, 12b1, and 12c1 of the vibrating arms 11a, 11b, and 11c.

In this case, the $SiO_2$-containing film in the vibrator element 1 functions as a temperature characteristics correction film for the vibrating arms 11a, 11b, and 11c.

Specifically, the slope of the frequency-temperature characteristics of the $SiO_2$-containing film in the vibrator element 1 corrects (cancels) the slope of the frequency-temperature characteristics of the vibrating arms 11a, 11b, and 11c that use Si as base material, and produces flat frequency-temperature characteristics.

In this way, the vibrator element 1 can suppress frequency fluctuations due to temperature changes, and can improve the frequency-temperature characteristics.

In the vibrator element 1, the $SiO_2$-containing film may be provided on the opposite side (the major surface 10b side) of the first electrodes 12a1, 12b1, and 12c1 (the major surface 10a side) of the vibrating arms 11a, 11b, and 11c.

The effect obtained as above also can be obtained with this configuration of the vibrator element 1.

Second Embodiment

The following describes a vibrator provided with the vibrator element described in First Embodiment.

Figure 5A:
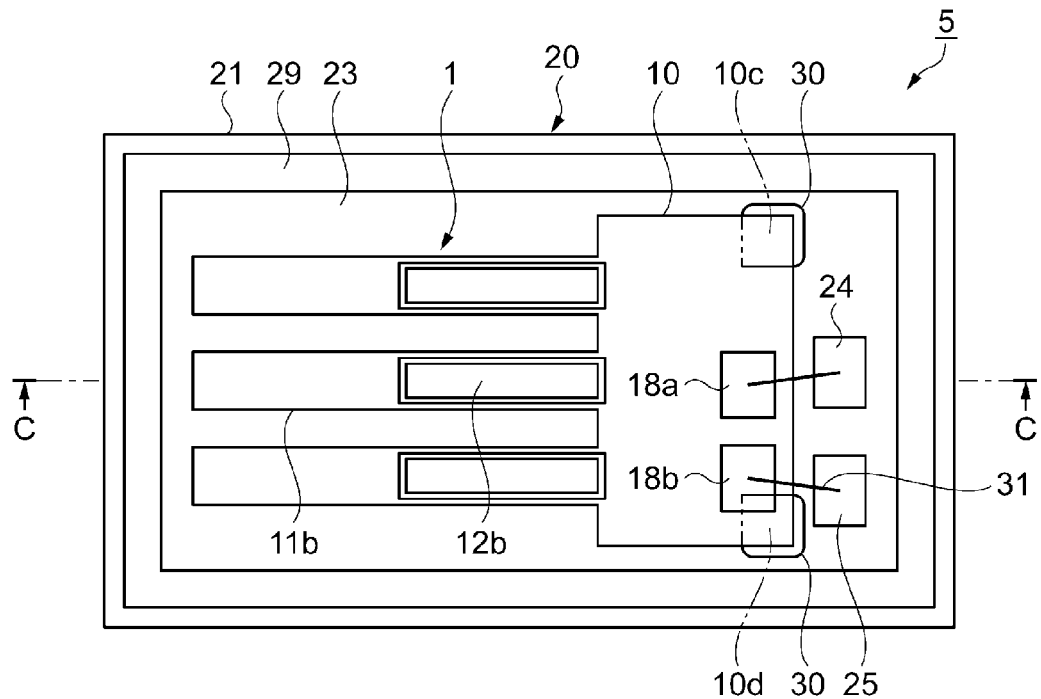
Figure 5B:
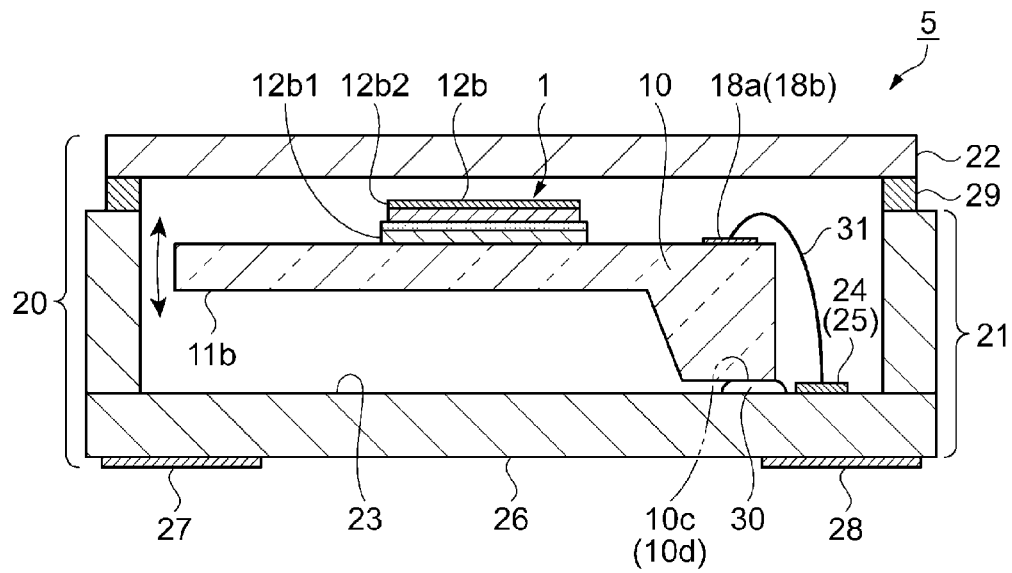

FIGS. 5A and 5B are schematic diagrams illustrating a schematic structure of the vibrator of Second Embodiment. FIG. 5A is a plan view as viewed from the lid (cap) side, and FIG. 5B is a cross sectional view taken at line C-C of FIG. 5A. The lid is omitted in the plan view. Wires are also omitted.

Common elements already described in First Embodiment are given the same reference numerals, and detailed explanations thereof are omitted. Descriptions will primarily focus on differences from First Embodiment.

As illustrated in FIGS. 5A and 5B, a vibrator 5 includes the vibrator element 1 described in First Embodiment, and a package 20 housing the vibrator element 1.

The package 20 is substantially cuboid in shape, and includes a package base 21 having a substantially rectangular planar shape with a depression, and a plate-shaped lid 22 having a substantially rectangular planar shape covering the depression of the package base 21.

The package base 21 uses, for example, materials such as an aluminum oxide sintered body obtained by laminating and sintering a molded ceramic green sheet. Other examples include crystals, glass, and Si.

The lid 22 uses the same material used for the package base 21, or metals such as kovar, and 42 alloy.

The package base 21 includes inner terminals 24 and 25 on an inner bottom surface (the bottom surface inside the depression) 23.

The inner terminals 24 and 25 are substantially rectangular in shape, and are formed in the vicinity of interconnection electrodes 18a and 18b provided on the base portion 10 of the vibrator element 1. The interconnection electrodes 18a and 18b are connected to the first electrode (e.g., 12b1) and the second electrode (e.g., 12b2) of each excitation electrode (e.g., 12b) of the vibrator element 1 via wires (not illustrated).

For example, in the wiring shown in FIG. 2, the wire on one side of the alternate current power supply is connected to the interconnection electrode 18a, and the wire on the other side of the alternate current power supply is connected to the interconnection electrode 18b.

A pair of external terminals 27 and 28 for mounting external members such as an electronic device is formed on an outer bottom surface (the surface opposite the inner bottom surface 23; the bottom surface on the outer side) 26 of the package base 21.

The external terminals 27 and 28 are connected to the inner terminals 24 and 25 via inner wires (not illustrated). For example, the external terminal 27 is connected to the inner terminal 24, and the external terminal 28 is connected to the inner terminal 25.

The inner terminals 24 and 25, and the external terminals 27 and 28 use laminated metal films obtained by laminating coating materials such as Ni and Au on a metallization layer such as W and Mo, using a method such as plating.

In the vibrator 5, the fixing portions 10c and 10d of the base portion 10 of the vibrator element 1 are fixed to the inner bottom surface 23 of the package base 21 via an adhesive 30 of materials such as epoxy, silicone, and polyimide.

In the vibrator 5, the interconnection electrodes 18a and 18b of the vibrator element 1 are connected to the inner terminals 24 and 25 via metal wires 31 of materials such as Au and Al.

In the vibrator 5, inside of the package 20 is sealed air-tightly by bonding the package base 21 and the lid 22 to each other with a bonding member 29 such as a seam ring, low-melting-point glass, and an adhesive after covering the depression of the package base 21 with the lid 22 with the vibrator element 1 being connected to the inner terminals 24 and 25 of the package base 21.

Inside of the package 20 is kept in a reduced pressure state (high vacuum state), or charged with inert gas such as $N_2$, He (helium), and Ar.

The package may be configured from, for example, a plate-shaped package base, and a depressed lid. The package may have a depression in both the package base and the lid.

The base portion 10 of the vibrator element 1 may be fixed at portions other than the fixing portions 10c and 10d, for example, at a point that includes the center of a straight line connecting the fixing portion 10c and the fixing portion 10d to each other, instead of using the fixing portions 10c and 10d.

In this way, because the vibrator element 1 is fixed at a single point, distortions in the base portion 10 due to the generated thermal stress in the fixing portion can be suppressed.

Under the applied drive signal (alternating voltage) to the excitation electrodes (e.g., 12b) via the external terminals 27 and 28, the inner terminals 24 and 25, the metal wires 31, and the interconnection electrodes 18a and 18b, the vibrating arms (e.g., 11b) of the vibrator element 1 in the vibrator 5 oscillate (resonate) in thickness direction (direction of arrow in FIG. 5B) at a predetermined frequency (for example, about 32.768 kHz).

By the provision of the vibrator element 1, the vibrator 5 of Second Embodiment can have high reliability, and can exhibit the effects described in First Embodiment.

Third Embodiment

The following describes an oscillator provided with the vibrator element described in First Embodiment.

Figure 6A:
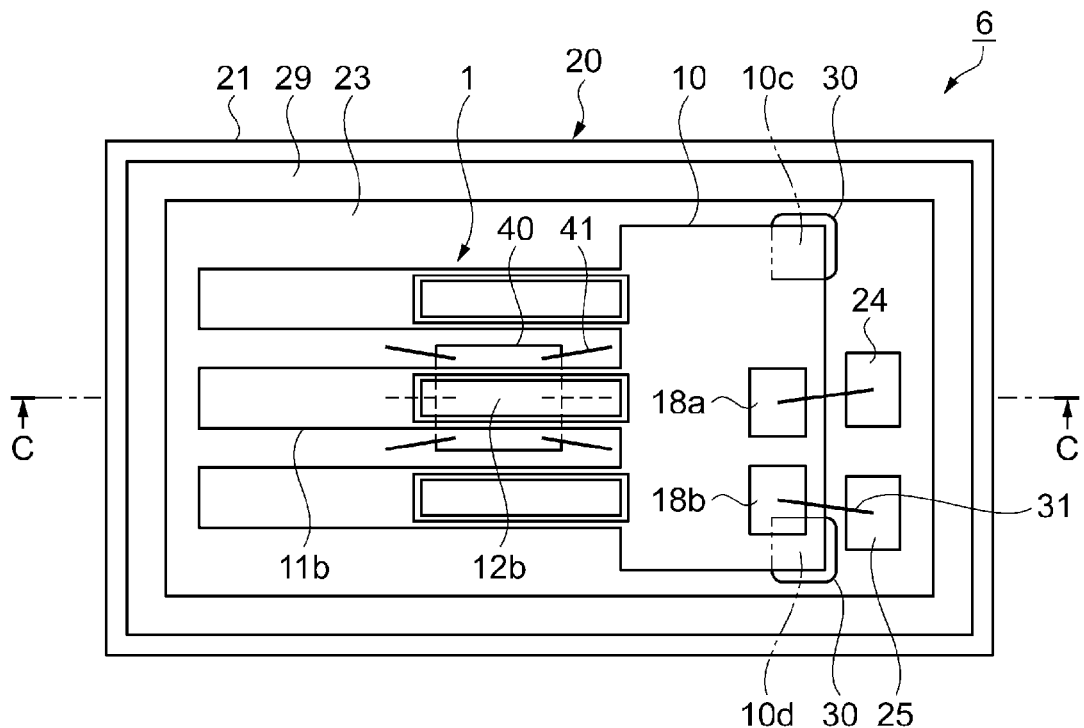
Figure 6B:
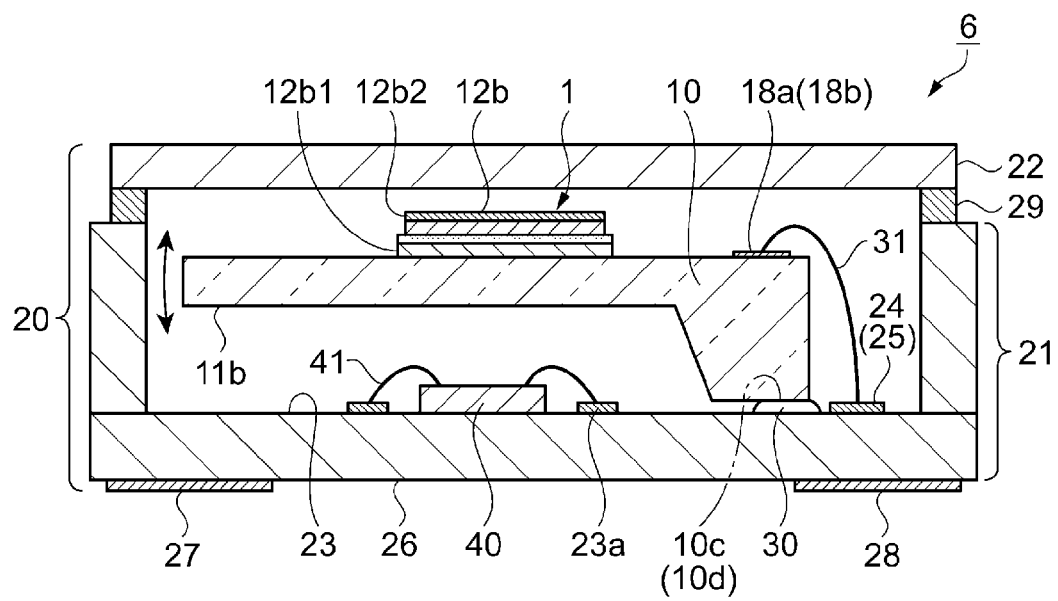

FIGS. 6A and 6B are schematic diagrams illustrating a schematic structure of the oscillator of Third Embodiment. FIG. 6A is a plan view as viewed from the lid side, and FIG. 6B is a cross sectional view taken at line C-C of FIG. 6A. The lid, and some of other constituting elements are omitted in the plan view. Wires are also omitted.

Common elements already described in First and Second Embodiments are given the same reference numerals, and detailed explanations thereof are omitted. Descriptions will primarily focus on differences from First and Second Embodiment.

As illustrated in FIGS. 6A and 6B, an oscillator 6 includes the vibrator element 1 described in First Embodiment, an IC chip 40 provided as an oscillation circuit for oscillating the vibrator element 1, and a package 20 housing the vibrator element 1 and the IC chip 40.

Inner connection terminals 23a are provided on an inner bottom surface 23 of a package base 21.

The IC chip 40 installing the oscillation circuit is fixed to the inner bottom surface 23 of the package base 21 with an adhesive or the like (not illustrated).

The IC chip 40 is connected to the inner connection terminals 23a at interconnection pads (not illustrated), using metal wires 41 of materials such as Au and Al.

The inner connection terminals 23a are formed of a laminated metal film obtained by laminating coating materials such as Ni and Au on a metallization layer such as W and Mo, using a method such as plating, and are connected to, for example, the external terminals 27 and 28, and the inner terminals 24 and 25 of the package 20 via inner wires (not illustrated).

Instead of the wire bonding using the metal wires 41, the interconnection pads of the IC chip 40 and the inner connection terminals 23a may be connected to each other by using, for example, an interconnection method based on flip-chip mounting, by flipping the IC chip 40.

Under the applied drive signal from the IC chip 40 to the excitation electrodes (e.g., 12b) via the inner connection terminals 23a, the inner terminals 24 and 25, the metal wires 31, and the interconnection electrodes 18a and 18b, the vibrating arms (e.g., 11b) of the vibrator element 1 in the oscillator 6 oscillate (resonate) at a predetermined frequency (for example, about 32.768 kHz).

The oscillator 6 outputs the resulting oscillation signals to outside via various elements, including the IC chip 40, the inner connection terminals 23a, and the external terminals 27 and 28.

By the provision of the vibrator element 1, the oscillator 6 of Third Embodiment can have high reliability, and can exhibit the effects described in First Embodiment.

Instead of using the IC chip 40 built into the package 20, the oscillator 6 may have an external module structure configuration (for example, a structure in which a vibrator having the vibrator element 1, and the IC chip are individually mounted on a single substrate).

Fourth Embodiment

The following describes a cell phone as an electronic device provided with the vibrator element described in First Embodiment.

Figure 7:
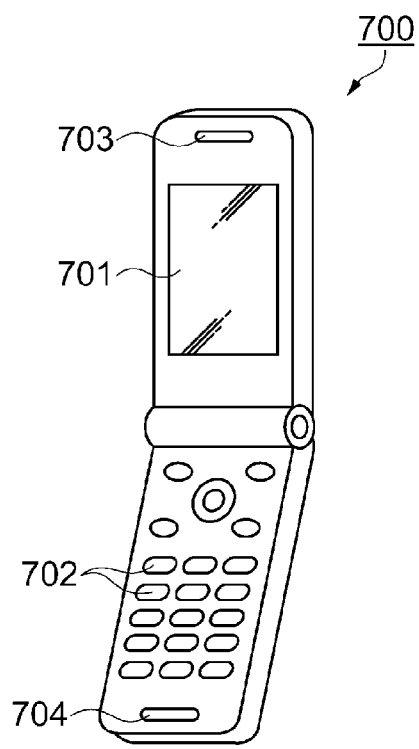
FIG. 7 is a schematic perspective view of a cell phone of Fourth Embodiment.

FIG. 7 is a schematic perspective view illustrating the cell phone of Fourth Embodiment.

A cell phone 700 shown in FIG. 7 is configured to include the vibrator element 1 of First Embodiment as a reference clock oscillation source. The cell phone 700 also includes a liquid crystal display device 701, a plurality of operation buttons 702, an earpiece 703, and a mouthpiece 704.

The vibrator element is not limited to the reference clock oscillation source of the cell phone, and may be preferably used, for example, as the reference clock oscillation source of devices such as digital books, personal computers, televisions, digital still cameras, video cameras, video recorders, navigation devices, pagers, electronic organizers, calculators,wordprocessors, workstations, video phones, POS terminals, and devices equipped with a touch panel. In any case, a highly reliable electronic device having the effects described in First Embodiment can be provided.

Fifth Embodiment

The following describes an automobile as an example of a moving obj ect provided with the vibrator element described in First Embodiment.

Figure 8:
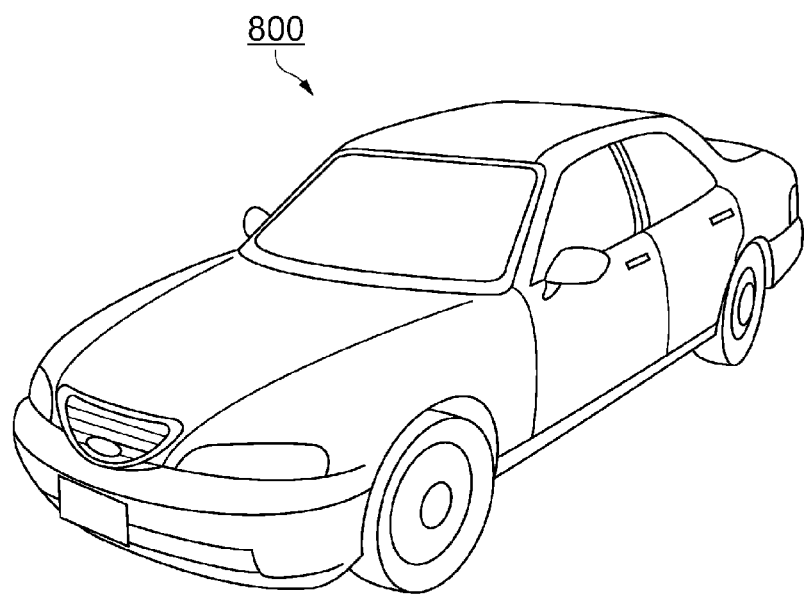
FIG. 8 is a schematic perspective view of an automobile of Fifth Embodiment.

FIG. 8 is a schematic perspective view illustrating the automobile of Fifth Embodiment.

An automobile 800 uses the vibrator element 1 of First Embodiment, for example, as the reference clock oscillation source of its electronically controlled devices (for example, such as an electronically controlled fuel injection device, an electronically controlled ABS device, and an electronically controlled autocruise device).

By the provision of the vibrator element 1, the automobile 800 has high reliability, and can exhibit excellent performance with the effects described in First Embodiment.

The vibrator element is not limited to the reference clock oscillation source of the automobile 800, and may be preferably used, for example, as the reference clock oscillation source of moving objects such as self-propelled robots, self-propelled transporting machines, trains, ships, airplanes, and artificial satellites. In any case, a highly reliable moving object having the effects described in First Embodiment can be provided.

When quartz crystal is used as base material of the vibrator element, the vibrator element may be prepared from, for example, a Z-cut plate, or an X-cut plate obtained by cutting quartz crystal ores in a predetermined angle. The etching process becomes easier when Z-cut plates of certain characteristics are used.

The vibrating direction of the vibrator element is not limited to the Z-axis direction (thickness direction), and the vibrator element may vibrate, for example, in X-axis direction (the direction along the major surface) with the excitation electrodes provided on the side surfaces of the vibrating arms (the surfaces joining the major surfaces). Flexural vibration in this direction is called in-plane vibration.

The number of vibrating arms in the vibrator element is not limited to three, and 1, 2, 4, 5, or n (n is a natural number of 6 or more) vibrating arms may be provided.

The base portion of the vibrator element may have the same thickness as the vibrating arm. In this way, the vibrator element has a plate shape, and can be produced more easily.

The entire disclosure of Japanese Patent Application No. 2013-151378, filed Jul. 22, 2013 is expressly incorporated by reference herein.

What is claimed is:

1. A vibrator element comprising:
   a base portion; and
   a vibrating arm extending from the base portion,
   the vibrating arm including a piezoelectric film that contains Cu at a crystal grain boundary.
2. A vibrator comprising:
   the vibrator element of claim 1; and
   a package housing the vibrator element.
3. An oscillator comprising:
   the vibrator element of claim 1; and
   an oscillation circuit that oscillates the vibrator element.
4. An electronic device comprising the vibrator element of claim 1.
5. A moving object comprising the vibrator element of claim 1.
6. The vibrator element according to claim 1, wherein the piezoelectric film further includes AlN.
7. The vibrator element according to claim 1 wherein the piezoelectric film has a first surface and a second surface opposite to the first surface, and first and second conductive films are formed on the first and second surfaces, respectively.

* * * * *